United States Patent
McNitt et al.

(10) Patent No.: US 7,081,762 B2
(45) Date of Patent: Jul. 25, 2006

(54) METHOD AND APPARATUS FOR MEASURING HIGH SPEED GLITCH ENERGY IN AN INTEGRATED CIRCUIT

(75) Inventors: John L. McNitt, Fort Collins, CO (US); Scott C. Savage, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/631,610

(22) Filed: Jul. 31, 2003

(65) Prior Publication Data

US 2005/0024063 A1   Feb. 3, 2005

(51) Int. Cl.
*G01R 27/28* (2006.01)
*G06F 9/45* (2006.01)
*H04J 1/12* (2006.01)

(52) U.S. Cl. .................. 324/628; 370/201; 716/5
(58) Field of Classification Search ............. 324/522, 324/523, 524, 103 R, 103 P, 140 R, 141, 324/628, 452–456; 702/117–126; 714/712; 370/201, 286–9; 379/414–417; 716/5
See application file for complete search history.

(56) References Cited

U.S. PATENT DOCUMENTS

| | | | | |
|---|---|---|---|---|
| 4,495,621 A | * | 1/1985 | Nakagomi et al. | 714/709 |
| 5,032,785 A | * | 7/1991 | Mathis et al. | 324/107 |
| 5,570,029 A | * | 10/1996 | Bottman et al. | 324/628 |
| 6,487,703 B1 | * | 11/2002 | McBride et al. | 716/4 |
| 6,675,118 B1 | * | 1/2004 | Wanek et al. | 702/117 |
| 6,732,065 B1 | * | 5/2004 | Muddu | 703/2 |
| 6,751,079 B1 | * | 6/2004 | Bretschneider | 361/90 |

OTHER PUBLICATIONS

Bastos et al., "A 12-Bit Intrinsic Accuracy High-Speed CMOS DAC", IEEE Journal of Solid-State Circuits, vol. 33, No. 12, Dec. 1998; p. 1959-1969.*

* cited by examiner

*Primary Examiner*—Anjan Deb
*Assistant Examiner*—Jeff Natalini
(74) *Attorney, Agent, or Firm*—Westman, Champlin & Kelly

(57) ABSTRACT

A method and apparatus are provided for measuring high speed glitch energy between first and second. The method and apparatus induce a change in charge on the first node from a first charge level to a second charge level with glitch energy supplied by the second node. An amount of charge is then supplied to the first node to restore the charge on the first node from the second charge level toward the first charge level. A representation of the amount of charge supplied to the first node is measured.

13 Claims, 2 Drawing Sheets

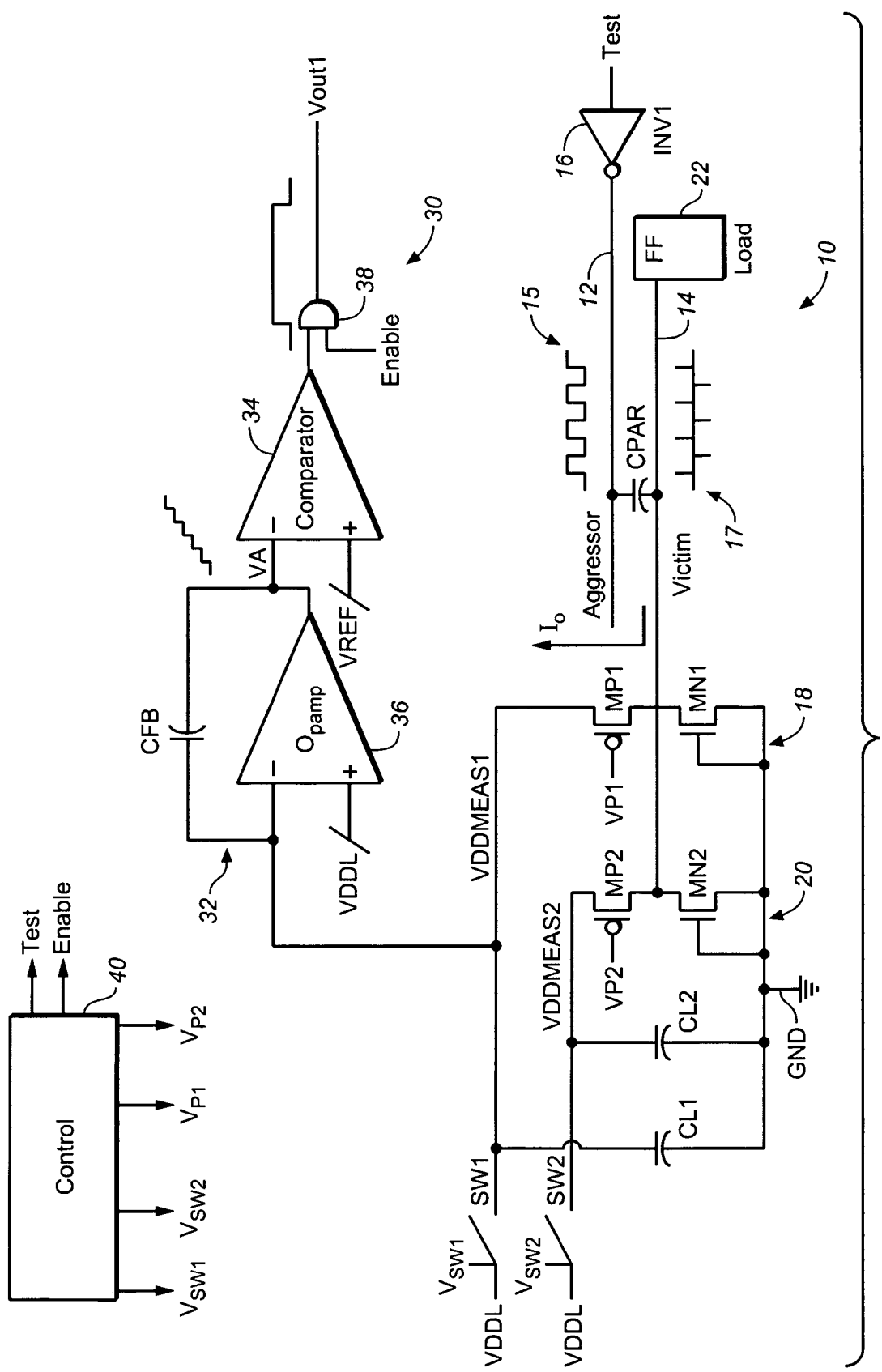
FIG._1

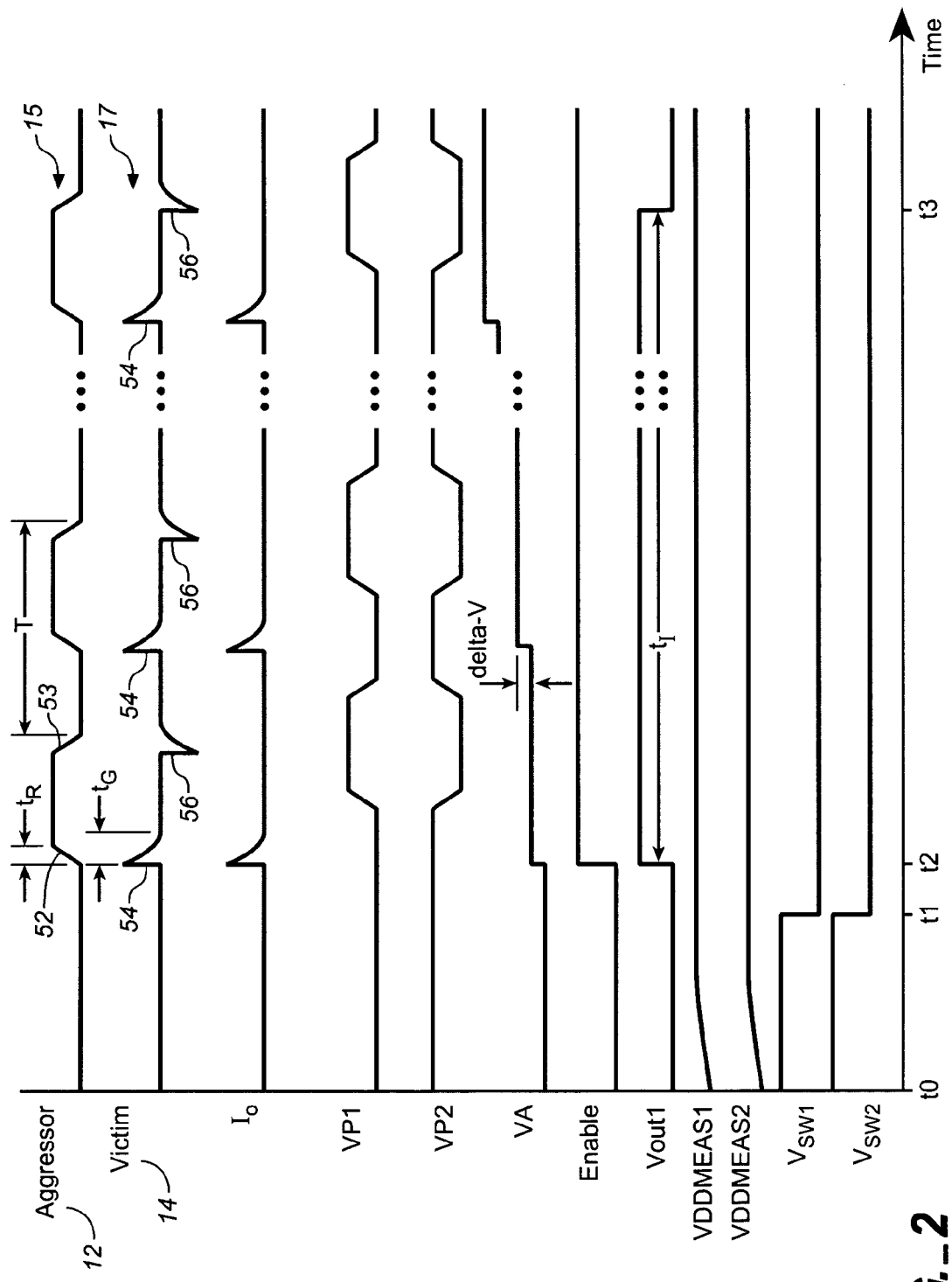
FIG._2

METHOD AND APPARATUS FOR MEASURING HIGH SPEED GLITCH ENERGY IN AN INTEGRATED CIRCUIT

FIELD OF THE INVENTION

The present invention relates to semiconductor integrated circuits, and more particularly to characterization of high speed glitch energy in an integrated circuit.

BACKGROUND OF THE INVENTION

In a semiconductor integrated circuit, signal lines between semiconductor devices are routed along predetermined routing layers. When two signal lines run adjacent and parallel to one another for any significant length, the signals on one line, which is generally referred to as an "aggressor" line, will capacitively couple energy pulses (glitches) onto the second line, which is generally referred to as a "victim" line.

If the area of the glitch pulse on the victim line becomes large enough, the glitch pulse can cause any semiconductor devices that are downstream of this line to change state. Since this changing of state is unintended, it can cause errors in the operation of the integrated circuit. Also, if the victim line is transferring data at the time of the glitch, the glitch can cause a delay in the data, possibly causing a substantial reduction in setup time in downstream memory devices. This delay can also cause a loss of data since the downstream devices may fail to switch when they are expected to switch.

Therefore it is common for integrated circuit manufacturers to attempt to characterize the parasitic capacitances that can be formed between signal lines for a given technology through some method of estimation or measurement. These characterizations can be used during the layout process to avoid such errors.

However glitch energy is, by definition, at a very high frequency. As a result, glitch energy has historically been very difficult to measure with any kind of accuracy. Since digital circuits generally operate at the edge of the technology's frequency limit, it is very difficult to design a circuit on the same integrated circuit chip that is "faster" than the glitches the circuit is trying to measure. Another difficulty with existing glitch measurement circuits, is the fact that any circuitry that is connected to the victim line to measure the glitch adds unwanted load capacitance to the victim line and affects the accuracy of the measurement.

For example, attempts have been made to measure the peaks of the glitches on the victim line by using very high-speed comparators. The comparators compare the amplitude of each glitch pulse to a reference voltage, which is varied until the comparator fails to trip on a glitch pulse. The resulting reference voltage is then representative of the amplitude of the glitch pulses. The two difficulties discussed above (speed and unwanted capacitance on the victim line) apply to this type of measurement circuit. The comparator adds significant capacitance to the victim line, and the comparator is generally not fast enough to measure the peak of the glitch pulse.

Improved glitch energy measurement circuits are therefore desired.

SUMMARY OF THE INVENTION

One embodiment of the present invention is directed to a method of measuring high speed glitch energy between first and second nodes. The method includes: (a) inducing a change in charge on the first node from a first charge level to a second charge level with glitch energy supplied by the second node; (b) supplying an amount of charge to the first node to restore the charge on the first node from the second charge level toward the first charge level; and (c) measuring a representation of the amount of charge supplied in (b).

Another embodiment of the present invention is directed to a high speed glitch energy measurement circuit. The circuit includes first and second voltage supply terminals and first and second nodes. First and second driver elements are coupled to drive the first and second nodes, respectively. The first driver element is biased between a measurement node and the second voltage supply terminal. The measurement node is selectively coupled to the first voltage supply terminal. A charge measurement circuit is coupled to the measurement node.

Another embodiment of the present invention is directed to a high speed glitch energy measurement circuit, which includes first and second nodes, first and second driver elements coupled to drive the first and second nodes, respectively, and a charge measurement circuit. The charge measurement circuit measures a representation of a change in charge on the first node due to glitch energy from the second node without adding a load capacitance to the first node.

BRIEF DESCRIPTION OF THE DRAWINGS

FIG. 1 is a schematic diagram illustrating a glitch energy measurement circuit according to one embodiment of the present invention.

FIG. 2 is a waveform diagram illustrating various waveforms generated in the circuit shown in FIG. 1.

DETAILED DESCRIPTION OF ILLUSTRATIVE EMBODIMENTS

FIG. 1 is a schematic diagram illustrating a glitch energy measurement circuit 10 according to one embodiment of the present invention. Circuit 10 can be implemented on a semiconductor integrated circuit chip, such as a test chip or a regular product chip, for measuring and characterizing high speed cross-talk glitch energy between two adjacent conductors on the chip.

Circuit 10 includes first and second elongated conductors 12 and 14, which extend parallel to one another for at least a portion of their lengths, and preferably for a substantial distance, on the chip. Capacitor CPAR represents the parasitic capacitance that is present between the two conductors because of their close proximity to each other. During operation, signals 15 on conductor 12 capacitively couple energy pulses (or glitches) 17 onto conductor 14. Conductor 12 is referred to as an "aggressor" node, and conductor 14 is referred to as a "victim" node.

Aggressor node 12 is driven by a net driver element 16 based on an input test signal, TEST. In one embodiment, net driver element 16 is a digital logic inverter, labeled INV1. Victim node 14 is driven alternately by net driver elements 18 and 20. Net driver elements 18 and 20 collectively represent an inverter that might be driving victim node 14 at the time of a capacitively coupled glitch. Flip-flop 22 represents a typical load on victim node 14.

Net driver element 18 includes P-channel pull-up transistor MP1 and N-channel pull-down transistor MN1. Net driver element 20 includes P-channel pull-up transistor MP2 and N-channel pull-down transistor MN2. Transistor MP1 has a gate coupled to enable input VP1, a source coupled to measurement node VDDMEAS1 and a drain coupled to victim node 14. Transistor MN1 has a gate and source coupled to ground supply terminal GND and a drain coupled to victim node 14. Transistor MP2 has a gate coupled to enable input VP2, a source coupled to measurement node VDDMEAS2 and a drain coupled to victim node 14. Transistor MN2 has a gate and source coupled to ground supply terminal GND.

In this embodiment, net driver elements 18 and 20 are biased to drive victim node 14 to a logic high voltage (i.e., the voltage on power supply terminal VDDL) such that victim node 14 resides at the logic high voltage at the time of the glitch. However, circuit 10 can also be configured so that net driver elements 18 and 20 drive victim node 14 to a logic low voltage (GND) during the glitch in an alternative embodiment of the present invention.

With the configuration shown in FIG. 1, pull-down transistors MN1 and MN2 are biased in an off state, and pull-up transistors MP1 and MP2 are selectively biased in an on state when enabled by enable inputs VP1 and VP2, respectively.

Measurement node VDDMEAS1 is selectively coupled to power supply terminal VDDL through switch SW1, and measurement node VDDMEAS2 is selectively coupled to power supply terminal VDDL through switch SW2. Switches SW1 and SW2 are controlled by switch control inputs VSW1 and VSW2, respectively. Capacitor CL1 is coupled between measurement node VDDMEAS1 and ground supply terminal GND. Capacitor CL2 is coupled between measurement node VDDMEAS2 and ground supply terminal GND. Capacitors CL1 and CL2 preferably have capacitances that are much greater than the parasitic capacitance CPAR to allow the measurement nodes VDDMEAS1 and VDDMEAS2 to have relatively stable voltages during a measurement cycle.

A charge measurement circuit 30 is coupled to measurement node VDDMEAS1 for supplying charge to victim node 14 through transistor MP1 after each glitch in order to restore the voltage on the victim node to its initial voltage prior to the glitch. Charge measurement circuit 30 then measures the supplied charge. In one embodiment, charge measurement circuit 30 measures the total charge supplied over a plurality of glitches. The charge supplied through transistor MP1 can be positive or negative in alternative embodiments of the present invention.

Charge measurement circuit 30 includes integrating amplifier 32, comparator 34 and logic AND gate 38. Integrating amplifier 32 includes operational amplifier 36 and feedback capacitor CFB. Operational amplifier 36 has an inverting input coupled to measurement node VDDMEAS1, a non-inverting input coupled to power supply terminal VDDL and an output coupled to integrating node VA. Feedback capacitor CFB is coupled in a feedback path, between integrating node VA and the inverting input of operational amplifier 36.

Comparator 34 has an inverting input coupled to integrating node VA, a non-inverting input coupled to a reference voltage VREF and an output coupled to one of the inputs of AND gate 38. The other input of AND gate 38 is coupled to enable input ENABLE. The output of AND gate 38 is coupled to VOUT1.

A control circuit 40 controls the operating state of circuit 10 for inducing a sequence of voltage changes on aggressor node 12 and measuring the resulting glitch energy that is capacitively coupled to victim node 14. Control circuit 40 can be implemented in hardware, software or a combination of both hardware and software. Control circuit 40 includes switch control outputs VSW1 and VSW2 coupled to the corresponding switch control inputs of switches SW1 and SW2, net driver enable outputs VP1 and VP2 coupled to the corresponding enable inputs VP1 and VP2 at the gates of transistors MP1 and MP2, a test output TEST coupled to the input of net driver element 16, and an enable output ENABLE coupled to the enable input of AND gate 38.

FIG. 2 is a waveform diagram illustrating various waveforms generated in circuit 10 during a measurement operation according to one embodiment of the present invention. To begin a measurement, control circuit 10 activates switch control signals VSW1 and VSW2, at time t0, to close switches SW1 and SW2 and charge VDDMEAS1 and VDDMEAS2 up to the power supply voltage VDDL. Control circuit 40 also pulls VP1 low and VP2 high to enable transistor MP1 and disable transistor MP2. At time t1, control circuit 40 inactivates VSW1 and VSW2 to open switches SW1 and SW2, leaving VDDMEAS1 and VDDMEAS2, victim node 14, and integrating node VA at approximately VDDL. Control circuit 40 also holds ENABLE low, thereby forcing VOUT1 low until time t2.

At time t2, control circuit 40 sets ENABLE high, allowing VOUT1 to follow the output of comparator 34. The initial voltage on integrating node VA is approximately VDDL, which is less than the voltage reference VREF. Therefore, VOUT1 rises to a logic high level indicating the start of an integration cycle. At the same time as ENABLE goes high, control circuit 40 begins to output a sequence of pulses on test output TEST, which creates a corresponding sequence of pulses 15 on aggressor node 12. The sequence of pulses 15 has a clock rate with a period "T". Each pulse has a low-to-high voltage transition 52 and a high-to-low voltage transition 53. The low-to-high transitions have a rise time of "$t_r$". It is assumed that period T is significantly larger than the rise time $t_r$.

As the voltage on aggressor node 12 transitions from low to high, at transition 52, a positive energy pulse (glitch) 54 is capacitively coupled from aggressor node 12 to victim node 14. Similarly, as the voltage on aggressor node 12 transitions from high to low, at transition 53, a negative energy pulse (glitch) 56 is capacitively coupled from aggressor node 12 to victim node 14.

With each positive energy pulse 54, victim node 14 initially responds by changing its voltage from a first, initial voltage level VDDL to a second, higher voltage level in the same direction as the voltage moves on aggressor node 12. With each negative energy pulse 56, victim node 14 responds by changing its voltage from the initial voltage level VDDL to a third, lower voltage level in the same direction as the voltage moves on aggressor node 12.

To change the voltage across parasitic capacitance CPAR by VDDL, a total charge of Q1 must be deposited on CPAR where, $$Q1 = CPAR * VDDL \qquad \text{EQ. 1}$$

After the initial disturbance (with each positive glitch) on victim node 14, a current $I_o$ flows from victim node 14 to VDDMEAS1 to restore the voltage on the victim node to its original voltage VDDL. The amount of charge Q1 that is removed from victim node 14 is equivalent to an integration of the current $I_o$ over the total time $t_G$ of the glitch pulse 54. Therefore, the integral of $I_o$ over the total glitch time is representative of the cross-talk energy in glitch pulse 54.

This integral measurement is made by charge measurement circuit 30 (shown in FIG. 1). Operational amplifier 36 effectively keeps its two inputs, VDDMEAS1 and VDDL, at the same Voltage by integrating the Voltage on node VA. The Voltage increase on victim node 14 due to the charge Q1 flowing into CPAR will now appear on node VA, with VA=Q1/CFB. Each Voltage step "delta-V" on node VA is a measure of the charge Q1 needed to change the Voltage on CPAR by VDDL, as scaled by CFB (VA=Q1/CFB).

The voltage on node VA can be used directly as an analog measure of the glitch energy and can be averaged over a plurality of glitch pulses. Comparator 34 can be used if a digital output is desired. In the embodiment shown in FIG. 1, the voltage on node VA is allowed to increment with each positive glitch 54 on victim node 15 until node VA reaches VREF, at time t3. At time t3, the output of comparator 34 transitions low, indicating the end of the integration cycle. The integration cycle has a length $t_I$. The time $t_I$ represents the time it took node VA to increment from its initial value VDDL to VREF.

The average charge within each positive glitch 54 can therefore be calculated from, $$\text{Average}(Q1) = (CFB*(VA(init) - VREF))/(t_o/T) \qquad \text{Eq. 2}$$

Where all values are predetermined except for the time, $t_o$, it takes for node VA to integrate up to the level of VREF. This is the time during which VOUT1 is high.

It is desired that victim node 14 is not affected by the negative glitches 56 caused by the high-to-low voltage transitions on aggressor node 12. To accomplish this, control circuit 40 disables transistor MP1 during the negative glitches 56 and allows the charge associated with each negative glitch 56 to be absorbed into VDDMEAS2 instead, through transistor MP2. During each negative glitch, control circuit 40 inactivates VP1 and activates VP2, thereby turning off transistor MP1 and turning on transistor MP2.

In an alternative embodiment, the charge associated with negative glitches 56 is measured in the same manner as positive glitches 54 by coupling an additional charge measurement circuit, similar to circuit 30, to measurement node VDDMEAS2. In another alternative embodiment, VDDMEAS2 is reset to VDDL with each clock cycle, by turning switch SW2 on temporarily after each negative glitch 56. Also, victim node 14 can be normally biased to GND instead of VDDL in an alternative embodiment of the present invention. In this embodiment, pull-down transistors MN1 and MN2 are selectively enabled by control circuit 40 and coupled to ground terminal GND through a respective set of switches. A charge measurement circuit, similar to circuit 30, would be coupled to the source of transistor MN1, with the operational amplifier being referenced to GND.

The measurement circuit shown in FIG. 1 alleviates the problems associated with previous attempts to measure glitch energy by measuring the energy directly and by not adding any circuitry to the victim node. The measurement circuit measures the charge injected into the victim node after a glitch occurs. By measuring the charge flowing into the parasitic capacitance through a net driving element, and by not adding circuitry to the victim node, the circuit effectively removes the problem of loading the victim node. Also, the circuit allows a much longer time period (period T) than the width of the glitch ($t_g$) during which to restore charge on the victim node. Therefore, the bandwidth requirement of any circuitry used to measure the glitch energy is much less than what would be needed if a direct measurement of the glitch was performed.

Although the present invention has been described with reference to preferred embodiments, workers skilled in the art will recognize that changes may be made in form and detail without departing from the spirit and scope of the invention. For example, any suitable circuit can be used for measuring a representation of the charge that is needed to restore the victim node to its original charge level after a glitch. The term "coupled" as used in the specification and in the claims can include a direct connection or a connection through one or more additional components. Also, the current, voltage and/or charge that is added or supplied to the victim node can be positive or negative, depending on the particular configuration.

What is claimed is:

1. A method of measuring high-speed glitch energy between first and second nodes, the method comprising:
   (a) inducing a change in charge on the first node from a first charge level to a second charge level with glitch energy supplied by the second node;
   (b) supplying an amount of charge to the first node to restore the charge on the first node from the second charge level toward the first charge level; and
   (c) measuring a representation of the amount of charge supplied in (b).

2. The method of claim 1 wherein the first node is coupled between a first driver element and a load element and wherein supplying and amount of charge in (b) and measuring a representation of the amount of charge in (c) are performed without adding load capacitance to the first node.

3. The method of claim 2 and further comprising:
   (d) charging the first node to the first charge level with the first driver element prior to inducing the change in charge on the first node in (a), wherein (b) comprises supplying the amount of charge through the first driver element and (c) comprises measuring the amount of charge supplied through the first driver element in (b).

4. The method of claim 3 and further comprising:
   (e) biasing the first driver element between first and second voltage supply terminals while charging in (d) and isolating the first driver element from the first voltage supply terminal during steps (a) through (c).

5. The method of claim 4 wherein (a) comprises inducing a sequence of voltage changes on the second node, which alternate between a first polarity and a second, opposite polarity and wherein the method further comprises:
   (f) driving the first node toward a voltage on the first voltage supply terminal with a second driver element, which is selectively biased between the first and second voltage supply terminals;
   (g) enabling the first driver element and disabling the second driver element during the voltage changes of the first polarity;
   (h) disabling the first driver element and enabling the second driver element during the voltage changes of the second polarity.

6. The method of claim 1, wherein (c) comprises integrating the amount of charge necessary to restore the charge on the first node from the second charge level to the first charge level.

7. The method of claim 1 wherein:
   (a) comprises inducing a sequence of similarly polarized glitch energy pulses on the first node with voltage changes on second node; and
   (c) comprises measuring total charge added to the first node in (b) over a period of time due to the sequence of similarly polarized glitch energy pulses.

8. The method of claim 7 wherein (c) comprises integrating the total charge over the period of time to generate a measurement voltage and comparing the measurement voltage to a reference voltage.

9. A high speed glitch energy measurement circuit comprising:

first and second nodes;

first and second driver elements coupled to drive the first and second nodes, respectively; and charge measurement means for measuring a representation of a change in charge on the first node due to glitch energy from the second node without adding a load capacitance to the first node.

10. The high speed glitch energy measurement circuit of claim 9, wherein the charge measurement means comprises:

means for supplying an amount of charge to the first node to cancel the change in charge due to the glitch energy; and means for measuring the amount of charge.

11. The high speed glitch energy measurement circuit of claim 10, wherein the means for measuring comprises means for integrating the amount of charge.

12. The high speed glitch energy measurement circuit of claim 9 wherein the charge measurement means comprises means for measuring total charge added to the first node due to a plurality of similarly polarized glitch energy pulses from the second node over a period of time.

13. A high speed glitch energy measurement circuit comprising:

first and second nodes;

first and second driver elements coupled to drive the first and second nodes, respectively; and charge measurement means for measuring a representation of a change in charge on the first node due to glitch energy from the second node without adding a load capacitance to the first node, and comprising means for supplying an amount of charge to the first node to cancel the change in charge due to the glitch energy and means for measuring the amount of charge.

* * * * *